United States Patent [19]

Hirata et al.

[11] 4,263,659
[45] Apr. 21, 1981

[54] ELECTRONIC INSTRUMENT WITH A FLEXIBLE KEYBOARD

[75] Inventors: Osamu Hirata; Mitsuaki Seki, both of Tokyo, Japan

[73] Assignee: Canon Kabushiki Kaisha, Tokyo, Japan

[21] Appl. No.: 24,210

[22] Filed: Mar. 27, 1979

[30] Foreign Application Priority Data

Mar. 27, 1978 [JP] Japan .................................. 53-35237
Mar. 27, 1978 [JP] Japan .................................. 53-35238

[51] Int. Cl.$^3$ ............................................. G06F 7/48
[52] U.S. Cl. .................................. 364/709; 307/231; 340/365 C; 364/712
[58] Field of Search ............... 364/709, 712; 200/5 A, 200/292, 295; 174/68.5, 117 PC, 120 R, 120 AR; 339/17 F, 17 L; 361/398; 340/365 R, 365 C, 365 L; 307/231

[56] References Cited

U.S. PATENT DOCUMENTS

| | | | |
|---|---|---|---|
| 3,911,234 | 10/1975 | Kotaka | 200/5 A |
| 4,016,490 | 4/1977 | Weckenmann et al. | 340/365 C |
| 4,017,848 | 4/1977 | Tannas, Jr. | 340/365 R |
| 4,081,898 | 4/1978 | Taylor, Jr. et al. | 364/712 |
| 4,096,577 | 6/1978 | Ferber et al. | 364/709 |
| 4,104,728 | 8/1978 | Kasubuchi | 364/712 |
| 4,125,783 | 11/1978 | Sefton | 340/365 C |
| 4,145,584 | 3/1979 | Otterlei | 200/5 A |

Primary Examiner—Errol A. Krass
Attorney, Agent, or Firm—Fitzpatrick, Cella, Harper & Scinto

[57] ABSTRACT

An electronic instrument has a power switch provided on the upper surface of a keyboard. The keyboard comprises a substrate having transmitting electrodes and receiving electrodes and a flexible sheet having transparent electrodes in opposition to the transmitting and receiving electrodes. Between the substrate and flexible sheet there are arranged characters, symbols and the like. Cell, display device and logical operation elements are disposed gathered within a limited area of the substrate.

4 Claims, 6 Drawing Figures

ELECTRONIC INSTRUMENT WITH A FLEXIBLE KEYBOARD

BACKGROUND OF THE INVENTION

1. Field of the Invention

The present invention relates to a thin type electronic instrument such as electronic microcomputer and in particular to such electronic instrument which has a thickness in the order of from 0.5 to 2.0 mm and flexibility.

2. Description of the Prior Art

In making a thin and flexible microcomputer, man encounters some problems which the conventional microcomputer of rigid structure does not have. One of the problems concerns the mounting of the power switch. In most of the conventional rigid structures, the power switch was mounted on the side surface of the main body of the microcomputer. However, with the increasing tendency to minimization of the thickness of microcomputers it has become more and more difficult to mount the power switch on the side surface of the computer body. For a thin type microcomputer, therefore, the power switch must be provided on a surface coplanar to the keyboard surface.

As to the switching mechanism itself, there has been also a considerable change in recent years. Electronic power switches such as P1, P2 shown in FIGS. 5 and 6 of the accompanying drawing are rapidly replacing the conventional mechanical locking switch in the microcomputer art. In case of the power switches P1, P2, On-Off of a power source is effected by set-reset of an electronic flip-flop circuit. When such new type of power switch is employed, particular care should be taken to prevent the power source from being unintentionally switched on. Otherwise, the power of the cell may be consumed uselessly. This is true in particular when the microcomputer is made to have the same degree of flexibility as a credit card or cash card has, as in the cases of FIGS. 5 and 6. If a keyboard of the type having contacts made of electroconductive rubber or the like is used in the microcomputer, then the power switch P1 may be often turned On unintentionally and carelessly. This is very troublesome. Such trouble may be easily caused when a person carries it with him keeping it in his flexible pocketbook or card case.

Designing the keyboard is also a problem in making a thin and flexible microcomputer. Use of a conventional keyboard such as a two color molded plastics keyboard is undesirable because it is too thick and too expensive. A thin and relatively inexpensive keyboard can be obtained in a simple manner by printing characters and symbols on a thin keysheet constituting an even surface. But, the use of such keyboard has another drawback in that the printed characters and symbols are gradually rubbed off by repeated touching of fingers therewith and finally become unreadable.

SUMMARY OF THE INVENTION

Accordingly, it is an object of the invention to provide an electronic instrument having a flexible keyboard which is safe from unintentional turning-on of the power switch even when the keyboard is subjected to a strong bending force.

It is another object of the invention to provide an electronic instrument of the above mentioned type which is free from the trouble of the characters and symbols on the key surface being rubbed off with use.

It is a further object of the invention to provide an electronic instrument of the above mentioned type in which the cell, display device and logical operation elements are disposed gathered in a limited area of the substrate so as to assure the desired flexibility of the keyboard and also to prevent the display device from being broken down.

Other and further objects, features and advantages of the invention will appear more fully from the following description taken in connection with the accompanying drawings.

DESCRIPTION OF THE PREFERRED EMBODIMENTS

Figure 1:
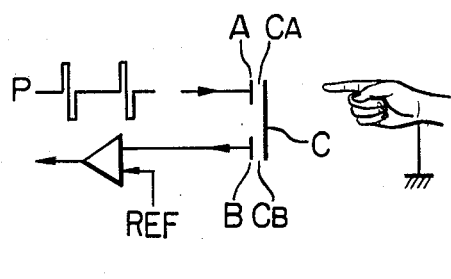
FIG. 1 illustrates the principle of the present invention.

FIG. 1 illustrates the principle of a key switch used in the invention.

Signal P is transmitted first from a transmitting electrode A to an opposite electrode C through an electrostatic capacity $C_A$ and then to a receiving electrode B through an electrostatic capacity $C_B$. When the operator touches the opposite electrode C with a finger, a larger portion of the signal P flows into his body and thereby the signal P at the receiving electrode B is weakened. In order to detect that the key has been operated, the received signal P is compared with a reference signal ref at the side of the receiving part. When the received signal becomes smaller than the reference signal, it is detected.

This type of switch has an advantage in that the power switch is turned On only when the key switch is touched by the finger. Therefore, it is particularly suitable for a thin and flexible microcomputer.

Figure 2:
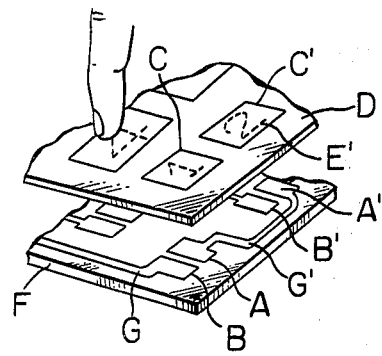
FIG. 2 shows an embodiment of key switch in accordance with the invention.

In FIG. 2 showing an embodiment of the invention, A and A' designate transmitting electrodes and B and B' receiving electrodes. C and C' are transparent electrodes which are formed, for example, by vapor depositing palladium alloy, indium oxide or tin oxide on a flexible and transparent sheet D made of resin such as polyethylene telephthalate or vinyl chloride. On the backside surface of the flexible sheet D there are marked characters and symbols E and E' by offset printing or silk screen printing. Since the characters or symbols E, E' are provided on the backside of the flexible sheet D which is not touched directly by the operator, they are hardly rubbed off with use. Designated by F is a substrate on which the transmitting electrodes A, A', receiving electrodes B, B' and wiring patterns for those electrodes are formed. As the substrate F there may be used a flexible printed circuit substrate generally employed in the art.

Figure 3:
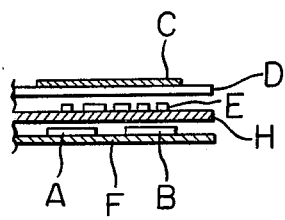
FIG. 3 shows another embodiment of key switch.

In FIG. 3 showing another embodiment, H designates an insulating flexible plate disposed between the substrate F and the sheet D. Symbols, color marks and characters are provided on the plate H by offset printing or silk screen printing and are visible through the transparent electrode C and the transparent sheet D.

Figure 4:
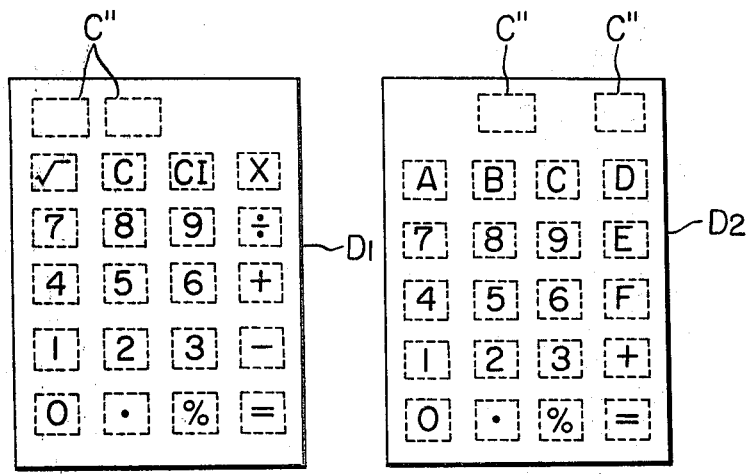
FIG. 4 shows further embodiment of key switch together with a series of codes provided thereon.

FIG. 4 shows a further embodiment wherein two sheets $D_1$ and $D_2$ are interchangeably used. Each sheet corresponds in structure to the sheet D shown in FIG. 2 and serves as a transparent electrode as well as a dial plate. Transparent electrodes C'' provided in the top column of the sheet at selected positions are used to detect which sheet is in use. At the area where the transparent electrode C'' is provided, signal P can be transmitted to the receiving electrode through the opposite electrode. But, at the area where the transparent electrode C'' is not provided, signal P can not be transmitted. This makes it possible to discriminate between sheet $D_1$ and sheet $D_2$. Thus, when the Keyboard is exchanged, it is possible automatically to switch the mode of operation.

In the shown embodiment, the transparent electrode is formed by an inactive film vapor deposited on the sheet. If necessary, the transparent electrode may be covered with a protecting film formed by vapor depositing aluminum or other suitable substance.

Figure 5:
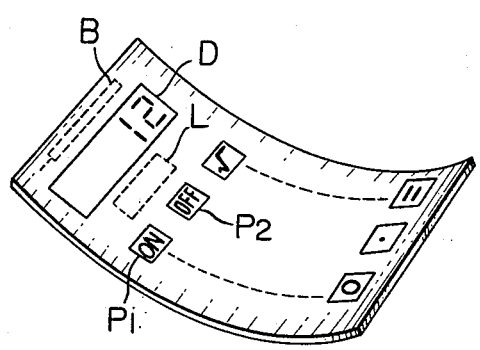
FIGS. 5 and 6 are schematic perspective views of thin and flexible microcomputers in accordance with the invention.
Figure 6:
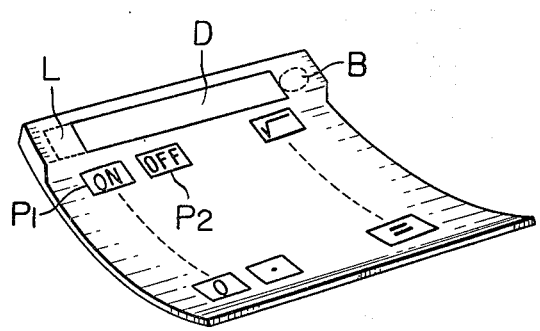

Examples of thin and flexible microcomputers designed in accordance with the present invention are shown in FIGS. 5 and 6 respectively. The thin and flexible microcomputer is provided with a keyboard as shown in FIG. 2. The power switch P1 can not be turned On by bending it however strong the bending may be. The power switch can be turned On only when it is touched by the finger, and by touching the switch P2 with finger, the power source can be cut off.

Designated by B is a power source cell which is of elongate or button form (FIGS. 5 and 6). D is a numeral display device of the passive and low electric power consumption type such as liquid crystal, electrochromie or PLZT. L represents logical operation elements such as LSI or super LSI. As shown in the drawing, these parts B, D and L are arranged together in the upper end area of the substrate F in such manner that the cell D and logical operation element L surround the most fragile member, that is, display device D to protect it against breaking. This arrangement has also such advantage that the remaining larger area of the key board can flex as a free end and thereby a high flexibility can be assured.

As will be understood from the foregoing, the present invention provides an improved thin microcomputer which can be carried in the pocket without fear of its being broken by shock. Since it is very flexible and can yield to the curve of the body line or body movement of a person who carriers it with him, it gives him no feeling of discomfort.

While the present invention has been particularly shown and described with reference to preferred embodiments thereof, it will be understood by those skilled in the art that the foregoing and other changes in form and details can be made therein without departing from the spirit and scope of the invention.

What we claim is:

1. An electronic apparatus comprising:
   a numerical display unit;
   a logic arithmetic element;
   a flexible substrate having a plurality of sets of pairs of receiving electrodes and transmitting electrodes; and
   a flexible transparent sheet having a plurality of transparent electrodes disposed on an upper surface thereof in such a relation that each of the transparent electrodes is located opposite and associated pair of receiving and transmitting electrodes of said flexible substrate,
   wherein a flexible keyboard is formed in combination with said flexible substrate and said flexible transparent sheet, each pair of receiving and transmitting electrodes being adapted to produce a key signal, at least one pair of receiving and transmitting electrodes being used for a power switch, and said power switch being constructed such that it turns on by a change of capacity thereby preventing said power switch from turning on in the event that said flexible keyboard is curved by application of an external force.

2. An electronic apparatus according to claim 1 wherein a flexible member for key representation such as characters, symbols and the like is interposed between said flexible substrate and said flexible transparent sheet.

3. An electronic apparatus according to claim 2 wherein said flexible member is disposed on the back of said flexible transparent sheet.

4. An electronic apparatus according to claim 2 wherein said characters, symbols and the like are provided on a surface of a flexible plate.

* * * * *

UNITED STATES PATENT AND TRADEMARK OFFICE
CERTIFICATE OF CORRECTION

PATENT NO. : 4,263,659
DATED : April 21, 1981
INVENTOR(S) : OSAMU HIRATA, ET AL.

It is certified that error appears in the above—identified patent and that said Letters Patent is hereby corrected as shown below:

Column 4, line 22, change "and" to --an--.

Signed and Sealed this

Thirtieth Day of June 1981

[SEAL]

Attest:

RENE D. TEGTMEYER

Attesting Officer     Acting Commissioner of Patents and Trademarks